(12) United States Patent
Iwatani

(10) Patent No.: US 12,386,274 B2
(45) Date of Patent: Aug. 12, 2025

(54) STAGE DEVICE, LITHOGRAPHY APPARATUS, AND ARTICLE MANUFACTURING METHOD

(71) Applicant: CANON KABUSHIKI KAISHA, Tokyo (JP)

(72) Inventor: Satoshi Iwatani, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 626 days.

(21) Appl. No.: 17/684,541

(22) Filed: Mar. 2, 2022

(65) Prior Publication Data

US 2022/0283518 A1 Sep. 8, 2022

(30) Foreign Application Priority Data

Mar. 5, 2021 (JP) ................................. 2021-035636

(51) Int. Cl.
*G03F 7/00* (2006.01)

(52) U.S. Cl.
CPC ...... *G03F 7/70725* (2013.01); *G03F 7/70408* (2013.01); *G03F 7/70758* (2013.01); *G03F 7/70775* (2013.01)

(58) Field of Classification Search
CPC ........................ G03F 7/70775; G01D 5/34746
USPC ....................................................... 356/616
See application file for complete search history.

(56) References Cited

U.S. PATENT DOCUMENTS

| | | | |
|---|---|---|---|
| 5,610,715 A * | 3/1997 | Yoshii | G03F 7/70775 356/499 |
| 5,757,160 A * | 5/1998 | Kreuzer | G03F 7/70716 318/649 |
| 7,633,619 B2 | 12/2009 | Kwan | |
| 8,582,084 B2 | 11/2013 | Shibazaki | |
| 8,988,690 B2 | 3/2015 | Deck et al. | |
| 9,423,703 B2 | 8/2016 | Shibazaki | |

(Continued)

FOREIGN PATENT DOCUMENTS

| | | |
|---|---|---|
| CN | 101356623 B | 5/2012 |
| CN | 102566317 A | 7/2012 |

(Continued)

OTHER PUBLICATIONS

Extended European search report issued in European Appln. No. 22157687.9 mailed on Jul. 26, 2022.

(Continued)

*Primary Examiner* — Steven H Whitesell

(74) *Attorney, Agent, or Firm* — ROSSI, KIMMS & McDOWELL LLP

(57) ABSTRACT

A stage device includes a stage capable of moving in a first direction and a second direction orthogonal to each other, a scale arranged in the stage so as to extend in the first direction, an optical assembly arranged so as to face the scale in at least a part of a movable range of the stage and extending in the second direction, and an interferometer configured to transmit measurement light and reference light to the optical assembly, and receive the measurement light and the reference light returning from the optical assembly. The optical assembly is configured to apply the measurement light from the interferometer to the scale, and return the measurement light returning from the scale and the reference light to the interferometer.

15 Claims, 8 Drawing Sheets

(56) References Cited

U.S. PATENT DOCUMENTS

| | | | |
|---|---|---|---|
| 2001/0046053 A1* | 11/2001 | Hill | G03F 7/70775 356/500 |
| 2005/0190375 A1* | 9/2005 | Akimoto | G03F 7/70775 356/500 |
| 2007/0223007 A1* | 9/2007 | Klaver | G01D 5/38 356/499 |
| 2007/0288121 A1* | 12/2007 | Shibazaki | G03F 7/70775 702/94 |
| 2009/0001260 A1* | 1/2009 | Klaver | G01D 5/38 250/237 G |
| 2009/0262321 A1* | 10/2009 | Makinouchi | G03F 7/70725 355/77 |
| 2009/0310109 A1 | 12/2009 | Hattori | |
| 2012/0032067 A1 | 2/2012 | Goodwin et al. | |
| 2014/0049782 A1 | 2/2014 | Deck et al. | |
| 2014/0113234 A1* | 4/2014 | Ito | H01J 37/3174 430/296 |
| 2016/0102999 A1* | 4/2016 | Liesener | G01D 5/266 356/488 |

FOREIGN PATENT DOCUMENTS

| | | |
|---|---|---|
| JP | 2002151405 A | 5/2002 |
| JP | 2009033166 A | 2/2009 |
| JP | 2009302490 A | 12/2009 |
| JP | 2013101084 A | 5/2013 |
| JP | 2013525750 A | 6/2013 |
| JP | 2014190896 A | 10/2014 |
| KR | 1020130018284 A | 2/2013 |
| WO | 2011126610 A2 | 10/2011 |

OTHER PUBLICATIONS

Office Action issued in Taiwanese Appln. No. 111106723, dated Feb. 26, 2024. English translation provided.

Extended European Search Report issued in European Appln. No. 23192352.5 mailed Oct. 27, 2023.

Arbabi "Planar metasurface retroreflector," Nature Photonics, 11:414-420 (2017). Cited in the specification.

* cited by examiner

STAGE DEVICE, LITHOGRAPHY APPARATUS, AND ARTICLE MANUFACTURING METHOD

BACKGROUND OF THE INVENTION

Field of the Invention

The present invention relates to a stage device, a lithography apparatus, and an article manufacturing method.

Description of the Related Art

In a conventional exposure apparatus used for manufacturing an article such as a semiconductor device and a display device, a laser interferometer system that can measure the position and displacement amount of an object in high resolution stably over a long period of time has been used as a measurement system that measures the position of a stage. In recent years, due to demands for miniaturization of features and improvement of productivity, the stage device is required to have the positioning performance with high speed and high accuracy. In such a situation, a variation of a measurement value caused by fluctuation of air in the optical path of the laser interferometer is a factor that hinders improvement of the device pattern overlay performance which is the final performance of the exposure apparatus.

Japanese Patent Laid-Open No. 2002-151405 discloses, as an alternative to the laser interferometer system, an optical encoder system that can measure the posture of a stage device holding a substrate with respect to six DOF (Degrees Of Freedom). The optical encoder can include a scale that includes two-dimensional gratings regularly arrayed with a nanometer-order fine pitch, and a plurality of heads each of which applies a semiconductor laser beam to the scale, detects reflected light or diffracted light, and converts the light into incremental positional information. The encoder system is advantageous in that it is not influenced by fluctuation of air and the scale can be permanently fixed to a measurement target. This means that unless the scale is distorted by external heat or elasticity, the measurement value does not change. It is also possible to calibrate a measurement error regarding the linearity or orthogonality of the grating by, for example, vacuum measurement by the interferometer at the time of assembly and manufacture or the like. The encoder can provide a resolution of sub-nanometer by a combination with the calibration and interpolation technique. On the other hand, the encoder may be influenced by mechanical long-term variations such as a drift of the grating pitch of the scale, a drift of the scale holding unit, and thermal expansion.

Japanese Patent Laid-Open No. 2009-33166 discloses a measurement system that uses both of a laser interferometer and an encoder. In this measurement system, in a wide-range driving stroke of a stage device, highly accurate measurement in a short term/short section is performed by the encoder, and a variation in a long term/long section is corrected using the laser interferometer.

Japanese Patent Laid-Open No. 2013-525750 discloses an interference encoder system capable of multi-axis simultaneous measurement, which is an extension of the conventional laser interferometer system. Conventionally, a heterodyne interference laser interferometer has been used in an exposure apparatus. In the heterodyne interference laser interferometer, measurement light and reference light are emitted from a common light source, and a heterodyne signal is generated by overlapping the measurement light reflected by a measurement target and the reference light serving as a reference to make them interfere with each other. A phase change in the heterodyne signal can be converted into a relative position change of the measurement target. Japanese Patent Laid-Open No. 2013-525750 discloses an interference encoder that detects a relative position change of a measurement target by transmitting measurement light to a scale fixed to the measurement target and making the measurement light diffracted by the arrayed gratings of the scale interfere with reference light serving as a reference.

When the interference encoder system disclosed in Japanese Patent Laid-Open No. 2013-525750 is applied to an exposure apparatus and a stage device is provided with interferometer optical paths of two or more axes and a scale including two-dimensional gratings, it is possible to implement detection of a complete 3D posture with high speed and high accuracy without being influenced by fluctuation of surrounding air.

However, when it is tried to mount the encoder system in a stage device that has used the laser interferometer system so far, a practical problem occurs that the head and the scale cannot be arranged due to restriction on the layout space inside the exposure apparatus.

For example, it is conceivable to apply, to a wafer stage, the multidimensional encoder system disclosed in Japanese Patent Laid-Open No. 2002-151405. In this case, in order to measure the driving region of the wafer stage and control the position, each of a plurality of encoder heads may be installed in a movable part of the stage and a plurality of large-area scales may be fixed to a barrel support body which holds a reduced projection lens above the wafer stage. In this case, the relative distance between the stage and the barrel support body or the reduced projection lens is measured. That is, in the simplest way to use the multidimensional encoder, the head is arranged in a movable part and the scale is arranged in a stationary part.

However, in addition to the reduced projection lens, subunits such as various kinds of optical systems, a focus detection system, a substrate conveyance mechanism, and an air conditioning control mechanism exist in the barrel support body, so that it is very difficult to provide a space for arranging the large-area scale as described above.

To the contrary, Japanese Patent Laid-Open No. 2009-33166 discloses that a scale is arranged on the side of a movable part of a stage and a plurality of encoder heads are fixed above the stage so that position control is performed by switching the head in accordance with the position of the stage. In such a type in which a scale is arranged in a movable part and each head is arranged in a stationary part, the area of the scale can be reduced, but it is necessary to arrange multiple heads at constant intervals in a two-dimensional plane on the side of a barrel support body. Further, in addition to the complicated head switching operation, it is difficult in practice to ensure a space for fixing the plurality of heads in a thermally and mechanically stable manner. Hence, the difficulty in design is not lowered compared to the type in which each head is arranged in a movable part and a scale is arranged in a stationary part. Also in the technique disclosed in Japanese Patent Laid-Open No. 2013-525750, it is inevitable that either of a plurality of heads and a large-area scale will be laid out in a main body frame portion, so there is a problem in mounting as in Japanese Patent Laid-Open Nos. 2002-151405 and 2009-33166.

SUMMARY OF THE INVENTION

The present invention provides a stage device including a measurement system which is easy to mount, a lithography apparatus, and an article manufacturing method.

One of aspects of the present invention provides a stage device comprising: a stage capable of moving in a first direction and a second direction orthogonal to each other; a scale arranged in the stage so as to extend in the first direction; an optical assembly arranged so as to face the scale in at least a part of a movable range of the stage and extending in the second direction; and an interferometer configured to transmit measurement light and reference light to the optical assembly, and receive the measurement light and the reference light returning from the optical assembly, wherein the optical assembly is configured to apply the measurement light from the interferometer to the scale, and return the measurement light returning from the scale and the reference light to the interferometer.

Further features of the present invention will become apparent from the following description of exemplary embodiments with reference to the attached drawings.

DESCRIPTION OF THE EMBODIMENTS

Figure 1:
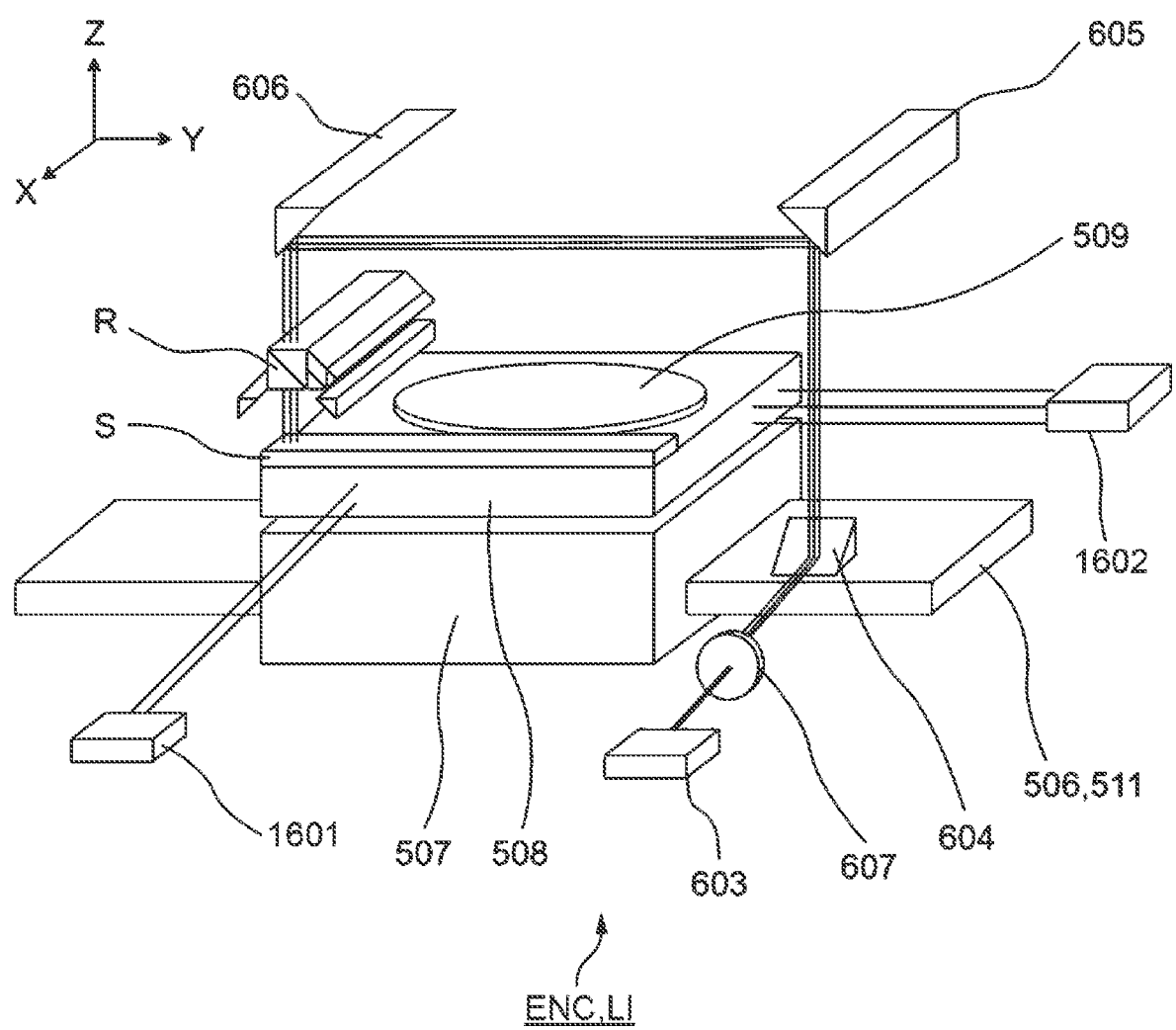
FIG. 1 is a perspective view schematically showing a configuration example of a measurement system including an interference encoder system and a laser interferometer system incorporated in an exposure apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

In this specification and drawings, structures and directions are described according to an XYZ coordinate system. A direction does not mean an absolute direction but means a relative relationship among a plurality of directions. For example, the X-axis direction, the Y-axis direction, and the Z-axis direction are directions orthogonal to each other.

Figure 5:
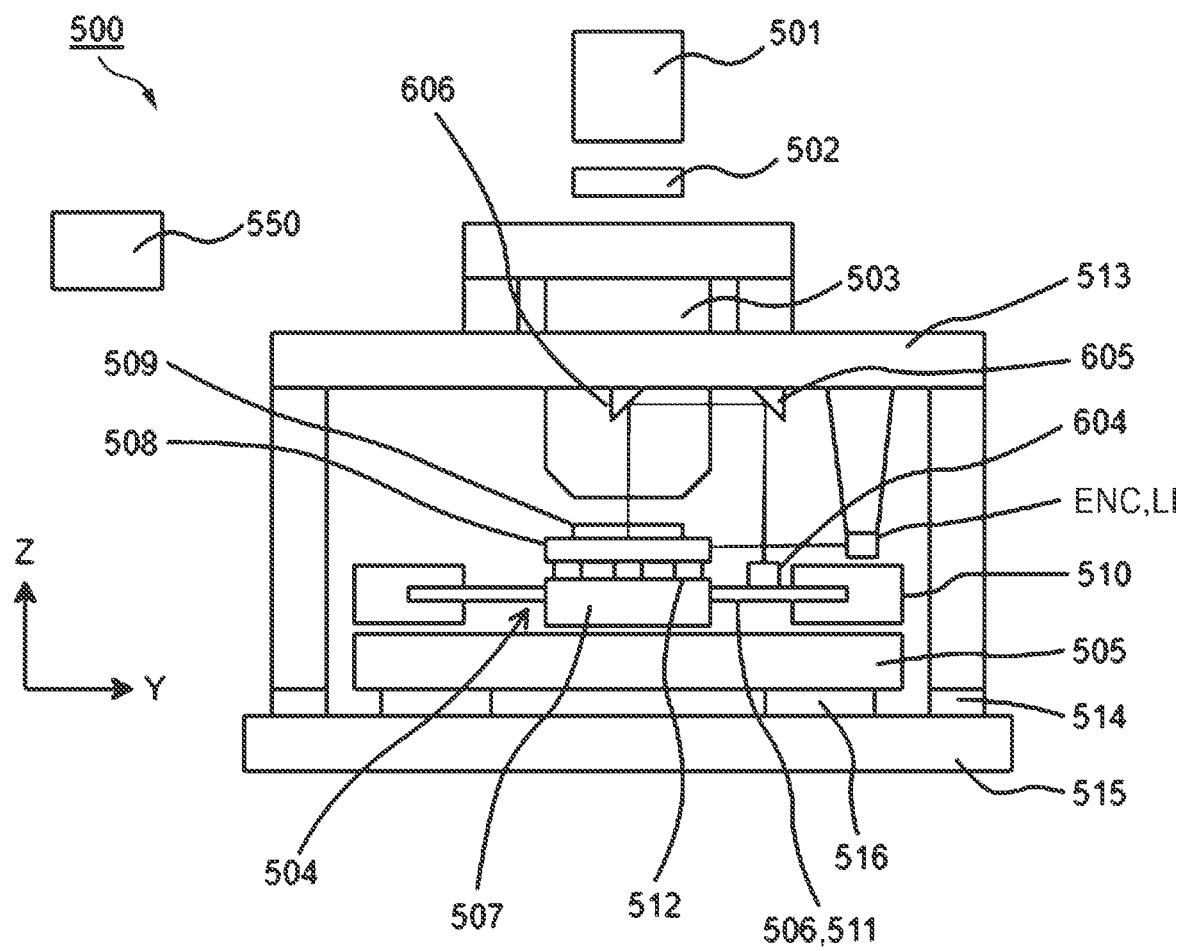
FIG. 5 is a view showing an arrangement example of an exposure apparatus according to an embodiment.

FIG. 5 shows the arrangement of an exposure apparatus 500 according to an embodiment. The exposure apparatus 500 is configured to project a pattern of an original (not shown) to a substrate and expose the substrate. The exposure apparatus 500 may be configured as a stepper which exposes a substrate in a state in which an original and the substrate are stationary, or may be configured as a scanner which exposes a substrate while scanning an original and the substrate. Further, the exposure apparatus 500 is an example of a lithography apparatus that transfers a pattern of an original to a substrate. Note that in the exposure apparatus 500, the pattern of the original is transferred in a form of a latent image to a photosensitive material (photo resist) applied to the substrate.

An illumination system 501 illuminates an original (not shown) mounted on an original stage 502, and a projection system 503 projects the pattern of the original to a substrate (not shown) mounted on a stage of a substrate stage mechanism 504 (to be also understood as a stage device or a positioning apparatus). The illumination system 501 and the projection system 503 form a transfer unit that transfers the pattern of the original to the substrate. The substrate stage mechanism 504 can include an X stage 506 that can move relative to a base 505 with a long stroke in the X-axis direction, and a Y stage 507 that can move relative to the X stage 506 with a long stroke in the Y-axis direction. The substrate stage mechanism 504 can also include a fine movement stage (stage) 508 that can move relative to the Y stage 507 with a short stroke in the X-axis direction, the Y-axis direction, the Z-axis direction (the optical axis direction of the projection system 503), the wx-axis direction, the wy-axis direction, and the wz-axis direction (that is, six axis directions). The fine movement stage 508 may be understood as an example of a stage that can move in the X-axis direction (second direction) and the Y-axis direction (first direction) orthogonal to each other. Here, the wx-axis direction is a rotational direction around the X-axis, the wy-axis direction is a rotational direction around the Y-axis, and the wz-axis direction is a rotational direction around the Z-axis. Further, a position in the wx-axis direction means a rotational angle around the X-axis, a position in the wy-axis direction means a rotational angle around the Y-axis, and a position in the wz-axis direction means a rotational angle around the Z-axis. A substrate chuck 509 that holds the substrate can be arranged on the fine movement stage 508. However, the substrate chuck 509 may be understood as a component of the fine movement stage 508.

The X stage 506 can be driven by an X linear motor (actuator) 510. The X linear motor 510 can include an X linear motor stator 510b which can be formed by a plurality of coils arranged in the base 505, and an X linear motor movable element 510a which can be formed by a permanent magnet provided in the X stage 506. The Y stage 507 can be driven by a Y linear motor (actuator) 511. The Y linear motor 511 can include a Y linear motor stator 511b which can be formed by a plurality of coils arranged in the X stage 506, and a Y linear motor movable element 511a which can be formed by a permanent magnet provided in the Y stage 507.

A bearing can be arranged between the X stage 506 and the Y stage 507. The X stage 506 is driven in the X-axis direction by the X linear motor 510, and the Y stage 507 is also driven in the X-axis direction accordingly. The X stage 506 and the Y stage 507 can be supported by the base 505 via a gas bearing. The fine movement stage 508 can be driven with respect to six axes by a plurality of actuators such as linear motors (not shown). In an example, two X linear motors can be provided to drive the fine movement stage 508 in the X-axis direction, one Y linear motor can be provided to drive the fine movement stage 508 in the Y-axis direction, and three linear motors 512 can be provided to drive the fine movement stage 508 in the Z-axis direction. Each linear motor can include a coil (stator) arranged on the Y stage 507 and a permanent magnet (movable element) provided in the fine movement stage 508. Further, the fine movement stage 508 can be supported by a self-weight support mechanism (not shown) in a state in which the fine movement stage 508 is floating above the Y stage 507.

The projection system 503 includes a plurality of optical elements and a barrel that accommodates the plurality of optical elements, and the projection system 503 can be supported by a barrel support body 513. The barrel support body 513 can be supported by a base member 515 via an air mount 514, and the base 505 can be supported by the base member 515 via an air mount 516. Each of the air mounts 514 and 516 can include, for example, an active vibration isolator. The active vibration isolators reduce a vibration transmitted from the floor via the base member 515, and suppress, using built-in actuators and sensors, vibrations generated when objects supported by the barrel support body 513 and the base 505 are moved. The substrate stage mechanism 504 can include a laser interferometer system LI and an interference encoder system ENC for measuring the position of the fine movement stage 508.

Figure 6:
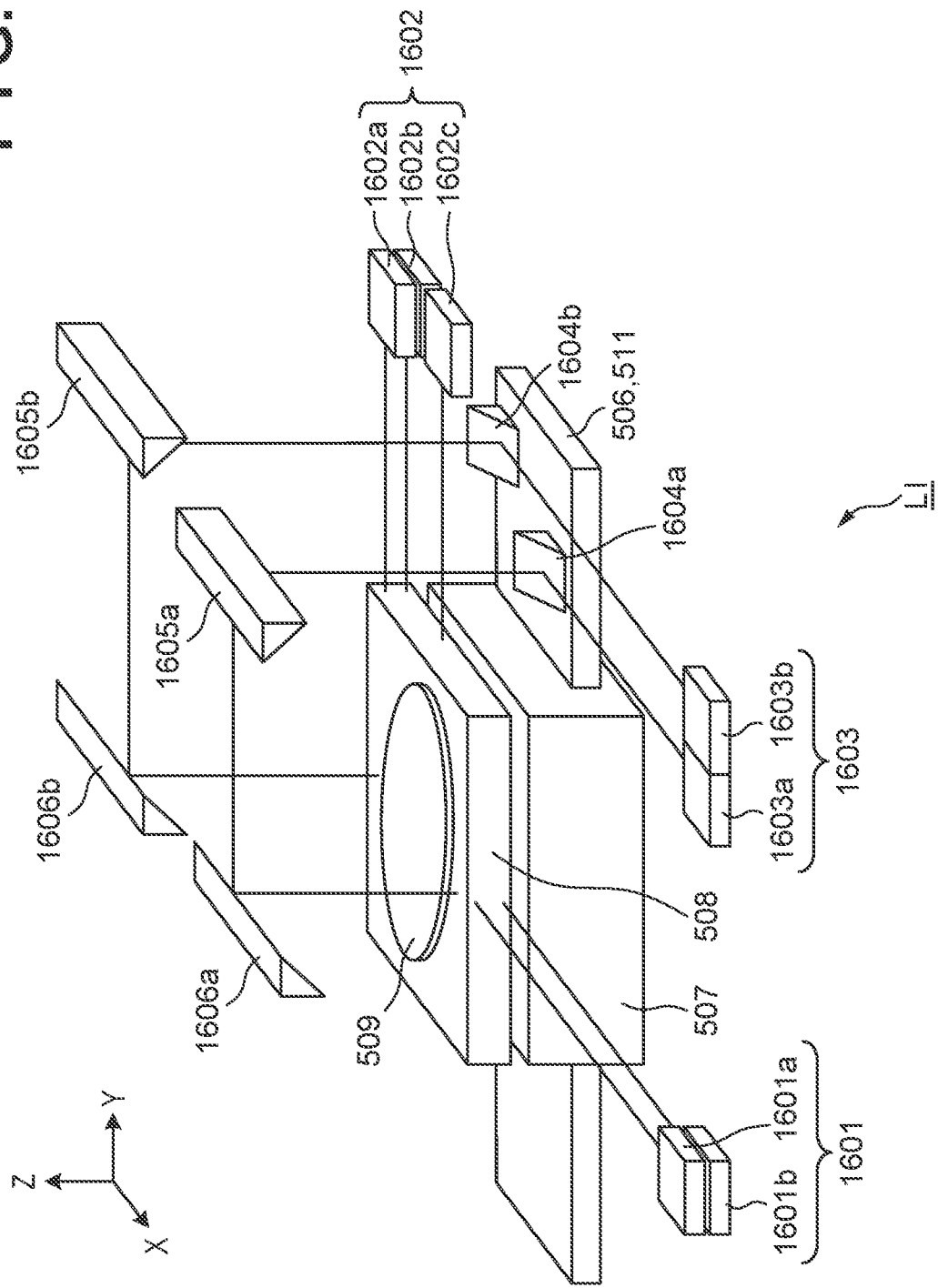
FIG. 6 is a view showing a configuration example of a laser interferometer system.

FIG. 6 shows a configuration example of the laser interferometer system LI. The laser interferometer system LI can include, for example, an X laser interferometer group 1601, a Y laser interferometer group 1602, and a Z laser interferometer group 1603. The X laser interferometer group 1601 can include X laser interferometers 1601a and 1601b. Each of the X laser interferometers 1601a and 1601b can be arranged so as to apply a measurement laser beam to a side surface of the fine movement stage 508. The X laser interferometers 1601a and 1601b can be arranged so as to apply the measurement laser beams to different height positions, respectively, in the side surface of the fine movement stage 508 to obtain tilt information (a rotational angle in the wy-axis direction) of the fine movement stage 508. Each of the X laser interferometers 1601a and 1601b applies measurement light (measurement laser beam), which travels in the X-axis direction, to a reflection surface provided in the side surface of the fine movement stage 508, and makes the reflected measurement light interfere with reference light reflected by a reference surface (not shown). Each of the X laser interferometers 1601a and 1601b measures or detects the position of the fine movement stage 508 in the X-axis direction based on an interference fringe generated by the interference. Based on the difference between the positions in the X-axis direction provided by the X laser interferometers 1601a and 1601b, the rotational angle (tilt information) in the wy-axis direction can be detected.

The Y laser interferometer group 1602 can include Y laser interferometers 1602a, 1602b, and 1602c. Each of the Y laser interferometers 1602a, 1602b, and 1602c can be arranged so as to apply a measurement laser beam to a side surface of the fine movement stage 508. The Y laser interferometers 1602a and 1602b can be arranged so as to apply the measurement laser beams to different height positions, respectively, in the side surface of the fine movement stage 508 to obtain tilt information (a rotational angle in the m-axis direction) of the fine movement stage 508. The Y laser interferometers 1602b and 1602c can be arranged so as to apply the measurement laser beams to different positions at the same height, respectively, in the side surface of the fine movement stage 508 to obtain rotational information (rotational angle in the wz-axis direction) of the fine movement stage 508. Each of the Y laser interferometers 1602a, 1602b, and 1602c applies measurement light (measurement laser beam), which travels in the Y-axis direction, to a reflection surface provided in the side surface of the fine movement stage 508, and makes the reflected measurement light interfere with reference light reflected by a reference surface (not shown). Each of the Y laser interferometers 1602a, 1602b, and 1602c measures or detects the position of the fine movement stage 508 in the Y-axis direction based on an interference fringe generated by the interference. Based on the differences among the positions in the Y-axis direction provided by the Y laser interferometers 1602a, 1602b, and 1602c, the rotational angle in the wx-axis direction and the rotational angle in the wz-axis direction can be detected.

The Z laser interferometer group 1603 can include a Z laser interferometers 1603a and 1603b. Each of the Z laser interferometers 1603a and 1603b can be arranged so as to apply a measurement laser beam to a top surface of the fine movement stage 508. Each of the Z laser interferometers 1603a and 1603b applies a measurement laser beam, which travels in the Z-axis direction, to a reflection surface provided in the top surface of the fine movement stage 508, and makes the reflected laser beam (measurement light) interfere with reference light reflected by a reference surface (not shown). Each of the Z laser interferometers 1603a and 1603b measures or detects the position of the fine movement stage 508 in the Z-axis direction based on an interference fringe generated by the interference. Based on the difference between the positions in the Z-axis direction provided by the Z laser interferometers 1603a and 1603b, the rotational angle (tilt information) in the wy-axis direction can be detected.

The measurement light (measurement laser beam) from the Z laser interferometer 1603a enters, via a mirror 1604a on the X stage 506 and mirrors 1605a and 1606a fixed to the barrel support body 513, the reflection surface provided in the top surface of the fine movement stage 508. The measurement light reflected by the reflection surface is guided to the Z laser interferometer 1603a via the mirrors 1606a, 1605a, and 1604a. On the other hand, the reference light (measurement laser beam) from the Z laser interferometer 1603a is applied to the mirror 1606a via the mirror 1604a on the X stage 506 and the mirror 1605a fixed to the barrel support body 513, and reflected by the mirror 1606a. The reference light reflected by the mirror 1606a is guided to the Z interferometer 1603a via the mirrors 1605a and 1604a.

The measurement light (measurement laser beam) from the Z laser interferometer 1603b enters, via a mirror 1604b on the X stage 506 and mirrors 1605b and 1606b fixed to the barrel support body 513, the reflection surface provided in the top surface of the fine movement stage 508. The measurement light reflected by the reflection surface is guided to the Z laser interferometer 1603b via the mirrors 1606b, 1605b, and 1604b. On the other hand, the reference light (measurement laser beam) from the Z laser interferometer 1603b is applied to the mirror 1606b via the mirror 1604b on the X stage 506 and the mirror 1605b fixed to the barrel support body 513, and reflected by the mirror 1606b. The reference light reflected by the mirror 1606b is guided to the Z interferometer 1603b via the mirrors 1605b and 1604b.

Each of the mirrors 1604a, 1604b, 1605a, and 1605b have an elongated shape along the X-axis direction, and the Z laser interferometers 1603a and 1603b are arranged outside the substrate stage mechanism 504. With the arrangement as described above, even when the fine movement stage 508 moves with a long stroke in the X-Y plane, the optical path of the Z laser interferometer 1603 passing above the fine movement stage 508 is not blocked and follows the movement of the fine movement stage 508. Accordingly, the measurement light (laser beam) is always applied to the reference surface in the top surface of the fine movement stage 508 regardless of the X-Y position of the fine movement stage 508. The projection system 503 is arranged between the mirror 606a and the mirror 606b. Hence, when the projection system 503 is located above one of the two reference surfaces provided in the top surface of the fine movement stage 508, the position can be measured using the other reference surface.

A position sensor (for example, a linear encoder) can be arranged between the fine movement stage 508 and the Y stage 507. In an example, three linear encoders can be arranged so as to measure the positions of the fine movement stage 508 in the Z-axis direction, the wx-axis direction, and the wy-axis direction with respect to the Y stage 507. Such the position sensor can be used to measure the shape of the reflection surface of the fine movement stage 508 or perform calibration. Another sensor such as a capacitance sensor may be used in place of the linear encoder.

The exposure apparatus 500 includes a controller 550. The controller 550 can be formed from, for example, a PLD (the abbreviation of a Programmable Logic Device) such as an FPGA (the abbreviation of a Field Programmable Gate Array), an ASIC (the abbreviation of an Application Specific Integrated Circuit), a general-purpose or dedicated computer installed with a program, or a combination of all or some of these components. The controller 550 may include a main controller and a stage controller. The main controller can control the overall operation of the exposure apparatus, and transmit position instruction information to the stage controller. Note that instead of transmitting position instruction information from the main controller to the stage controller, the main controller may transmit information required for generating the position instruction information and the stage controller may generate the position instruction information. The stage controller can be configured to control the fine movement stage 508 with respect to six axes based on the six-axis information of the fine movement stage 508 obtained using the laser interferometer system LI and the interference encoder system ENC.

FIG. 1 shows a configuration example of the measurement system including the interference encoder system ENC and the laser interferometer system LI incorporated in the exposure apparatus 500. The interference encoder system ENC can be incorporated in the substrate stage mechanism 504 or the exposure apparatus 500 without influencing the arrangements of the substrate stage mechanism 504 and the laser interferometer system LI shown in FIGS. 5 and 6. The interference encoder system ENC can include a scale S, an optical assembly R, and a Z interferometer (interferometer) 603. The scale S can be arranged on the fine movement stage 508 so as to extend in the Y-axis direction (first direction). The scale S can be arranged on the top surface of the fine movement stage 508. Gratings arrayed along the Y-axis direction with a nanometer-order fine pitch can be provided in the surface of the scale S. The entire size of the scale S need not have a large area that covers the entire movable range of the fine movement stage 508 in the X-axis direction and the Y-axis direction like an encoder layout in which a head is arranged in a movable part and a scale is arranged in a stationary part. The length of the scale S in the Y-axis direction may be the minimum length required for driving of the fine movement stage 508 in the Y-axis direction. Also, the width of the scale S in the X-axis direction may be the minimum width required for reflecting the measurement light transmitted through the optical assembly R.

The Z interferometer 603 can be configured to transmit measurement light and reference light to the optical assembly R, and receive the measurement light and the reference light returning from the optical assembly R. The optical assembly R can be configured to apply the measurement light from the Z interferometer 603 to the scale S and return, to the Z interferometer 603, the measurement light returning from the scale S and the reference light.

The optical assembly R can be arranged so as to face the scale S in at least a part of the movable range of the fine movement stage 508. The optical assembly R can extend in the X-axis direction (second direction). The optical assembly R can be an assembly of optical parts each having an elongated shape. The optical assembly R can be arranged so as to cross the scale S above the scale S. The optical assembly R can be statically held between a mirror 606 and the scale S at a predetermined distance from the scale S. Here, the optical assembly R can be supported by the barrel support body 513 or the projection system 503 in the posture in which the longitudinal direction of the optical assembly R is always parallel to the longitudinal direction (the X-axis direction in FIG. 1) of the mirror 606. Further, the optical assembly R is preferably supported by the barrel support body 513 or the projection system 503 via a heat insulation member.

The optical assembly R can separate, inside it, the measurement light and the reference light emitted from the Z interferometer 603 and guided to the optical assembly R via mirrors 604 and 605 and the mirror 606, and apply the measurement light to the surface of the scale S. Further, the optical assembly R retroreflects the measurement light reflected or diffracted by the surface of the scale S toward the scale S at least once, recombines the measurement light returning from the scale S with the reference light, and returns the combined light to the Z interferometer 603. Similar to the scale S, the length of the optical assembly R in the longitudinal direction can be the minimum length required for driving of the fine movement stage 508 in the X-axis direction and transmission of the measurement light. The mirror 604 (first mirror) can be arranged on the X stage 506 (movable body) which moves in the X-axis direction (second direction) together with the fine movement stage 508. The mirror 605 (second mirror) and the mirror 606 (third mirror) can be fixedly arranged away from the fine movement stage 508, the X stage 506, and the mirror 604, and extend in the X-axis direction. The mirrors 604, 605, and 606 can be arranged so as to form the optical path of each of the measurement light and the reference light between the Z interferometer 603 and the optical assembly R.

Figure 2A:
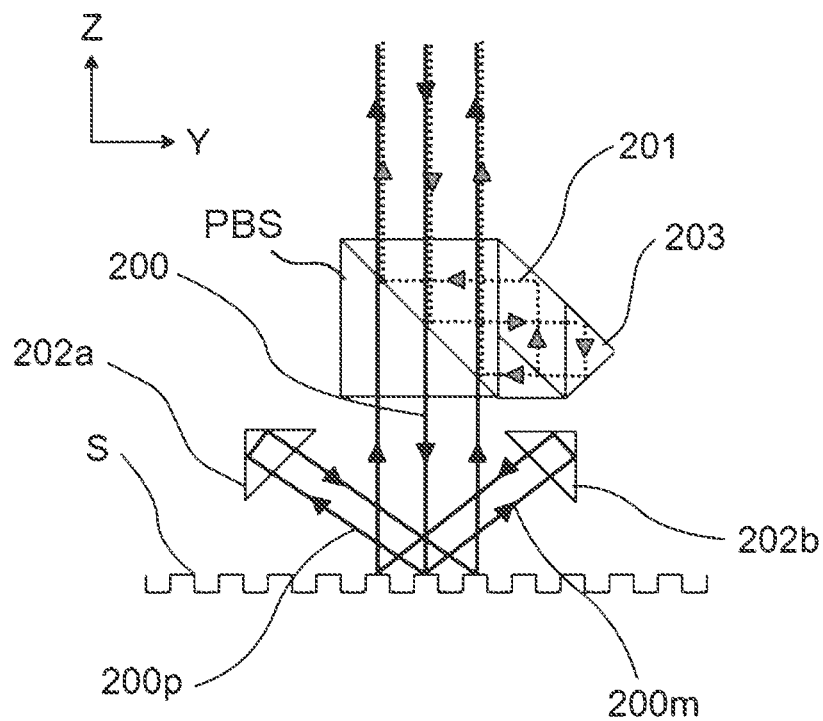
FIGS. 2A and 2B are views showing an arrangement example of an optical assembly.
Figure 2B:
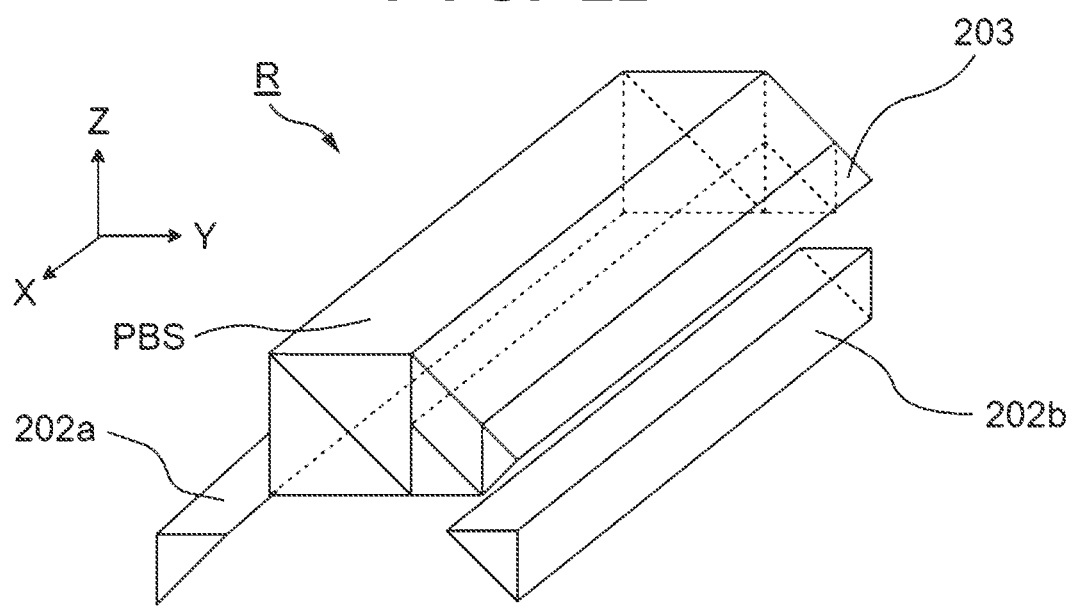

FIGS. 2A and 2B show an arrangement example of the optical assembly R. In FIG. 2A, a solid line with an arrow indicates the optical path of measurement light 200, and a dashed line with an arrow indicates the optical path of reference light 201. The arrow indicates the travel direction of each of the measurement light and the reference light. The optical assembly R can include a beam splitter/combiner PBS, first retroreflectors 202a and 202b, and a second retroreflector 203. The beam splitter/combiner PBS separates the measurement light 200 and the reference light 201 provided by the Z interferometer 603, and combines the measurement light 200 and the reference light 201 to be returned to the Z interferometer 603. Each of the first retroreflectors 202a and 202b retroreflects, toward the scale S, the measurement light 200 emitted from the beam splitter/combiner PBS and diffracted by the scale S to cause the measurement light 200 to be reflected or diffracted by the scale S. That is, the measurement light 200 having entered each of the first retroreflectors 202a and 202b is retroreflected by the corresponding one of the retroreflectors 202a and 202b and then returns to the beam splitter/combiner PBS via the scale S. Each of the first retroreflectors 202a and 202b returns, to the beam splitter/combiner PBS, the measurement light 200 reflected or diffracted by the scale S. The second retroreflector 203 retroreflects the reference light emitted from the beam splitter/combiner PBS and returns it to the beam splitter/combiner PBS. The beam splitter/combiner PBS, the first retroreflectors 202a and 202b, and the second retroreflector 203 can extend in the X-axis direction (second direction).

The measurement light 200 and the reference light 201 provided to the optical assembly R via the mirror 604, 605, and 606 are separated by the beam splitter/combiner PBS, and the measurement light 200 alone is applied to the scale S. The measurement light 200 is diffracted by the scale S, and +1st-order diffracted light 200p and −1st-order diffracted light 200m are generated at a non-Littrow angle. The +1st-order diffracted light 200p is retroreflected by the retroreflector 202a, diffracted by the scale S again, and returns to the optical assembly R. Similarly, the −1st-order diffracted light 200m is retroreflected by the retroreflector 202b, diffracted by the scale S again, and returns to the optical assembly R.

On the other hand, the reference light 201 separated by the beam splitter/combiner PBS is retroreflected by the retroreflector 203 and returns to the beam splitter/combiner PBS. Each of the +1st-order diffracted light 200p and −1st-order diffracted light 200m of the measurement light 200 having returned from the scale S is combined with the reference light 201 having returned from the retroreflector 203, and emitted from the optical assembly R toward the mirror 606. The +1st-order diffracted light 200p and −1st-order diffracted light 200m of the measurement light 200 and the reference light 201 having traveled via the mirrors 606, 605, and 604 are combined by a polarizing plate 607 and return to the Z interferometer 603. The Z interferometer 603 detects an interference fringe or a phase signal according to the optical path difference between the +1st-order diffracted light 200p and the reference light 201 and the optical path difference between the −1st-order diffracted light 200m and the reference light 201. Based on the interference fringe or the phase difference, the Z interferometer 603 can generate positional information of the scale S regarding two degrees of freedom (the Z-axis direction and the Y-axis direction). For example, Japanese Patent Laid-Open No. 2013-525750 discloses an arithmetic expression for converting an obtained heterodyne phase signal into positional information regarding two degrees of freedom.

When the optical assembly R has the elongated shape extending in the X-axis direction as exemplarily shown in FIG. 1, the optical path of the Z interferometer 603 (the optical path of each of the measurement light 200 and the reference light 201) follows movement of the fine movement stage 508 in the X-axis direction and moves in the X-axis direction (longitudinal direction) above the fine movement stage 508. Accordingly, even if the incident position of each of the measurement light 200 and the reference light 201 with respect to the optical assembly R is moved in the X-axis direction, the optical path shown in FIG. 2A is always maintained in the Z-Y section of the optical assembly R, that is, the plane orthogonal to the longitudinal direction. Therefore, regardless of the incident position of each of the measurement light 200 and the reference light 201 in the X-axis direction with respect to the optical assembly R, the optical path length of each of the measurement light 200 and the reference light 201 remains unchanged.

Each of the retroreflectors 202a, 202b, and 203 shown in FIG. 2B can be an elongated prism obtained by orthogonally combining two flat surfaces. With such the configuration, each of the measurement light 200 and the reference light 201 always enters perpendicular to the respective surfaces of the optical assembly R and, as long as the postures of the optical assembly R and the scale S are ideally parallel to each other, the incident light is reflected twice and returns to the direction opposite to the incident direction. However, if the incident angle of each of the measurement light 200 and the reference light 201 with respect to the incident surface of the optical assembly R changes even a little in accordance with the incident position in the X-axis direction, the light returns in a direction shifted from the direction opposite to the incident direction, and this can cause a measurement error. For example, a case in which the postures of the optical assembly R and the scale S are not exactly parallel to each other and one of them is rotated in the wy-axis direction, a physical event in which the surface of the scale S is deformed by heat and changed over time, or the like can be assumed. In preparation for occurrence of a measurement error caused by an optical axis shift of each of the measurement light 200 and the reference light 201 or a change in posture of each of the optical assembly R and the fine movement stage 508, a correction table may be generated in advance to correct a measurement value of the interference encoder system ENC. The correction table can be generated using measurement values of the X laser interferometer group 1601, the Y laser interferometer group 1602, and the Z laser interferometer group 1603 of the laser interferometer system LI, or a focus detection unit (not shown) or the like incorporated in the exposure apparatus 500.

Figure 8A:
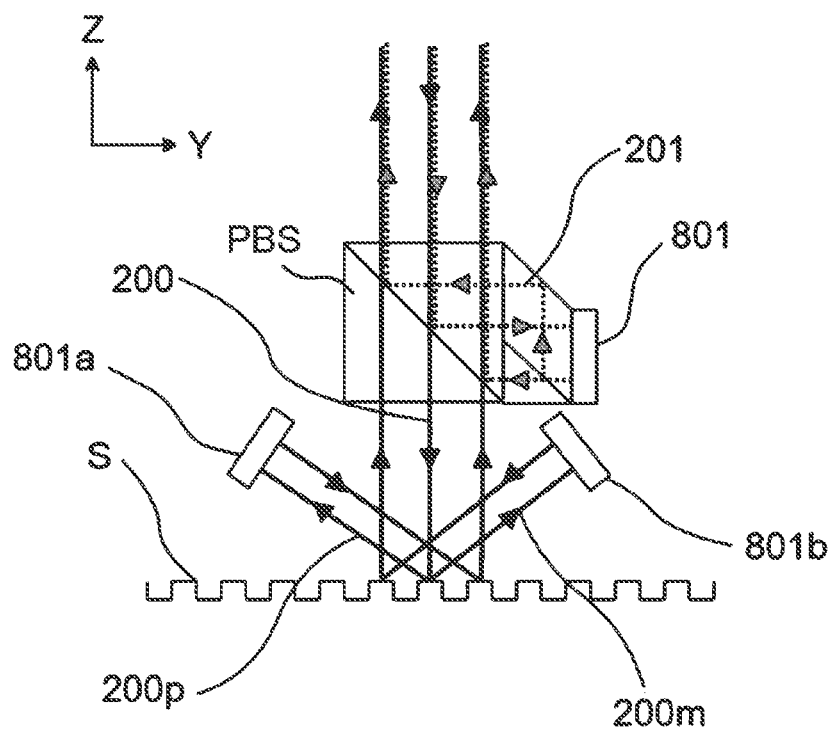
FIGS. 8A and 8B are views showing another arrangement example of the optical assembly.
Figure 8B:
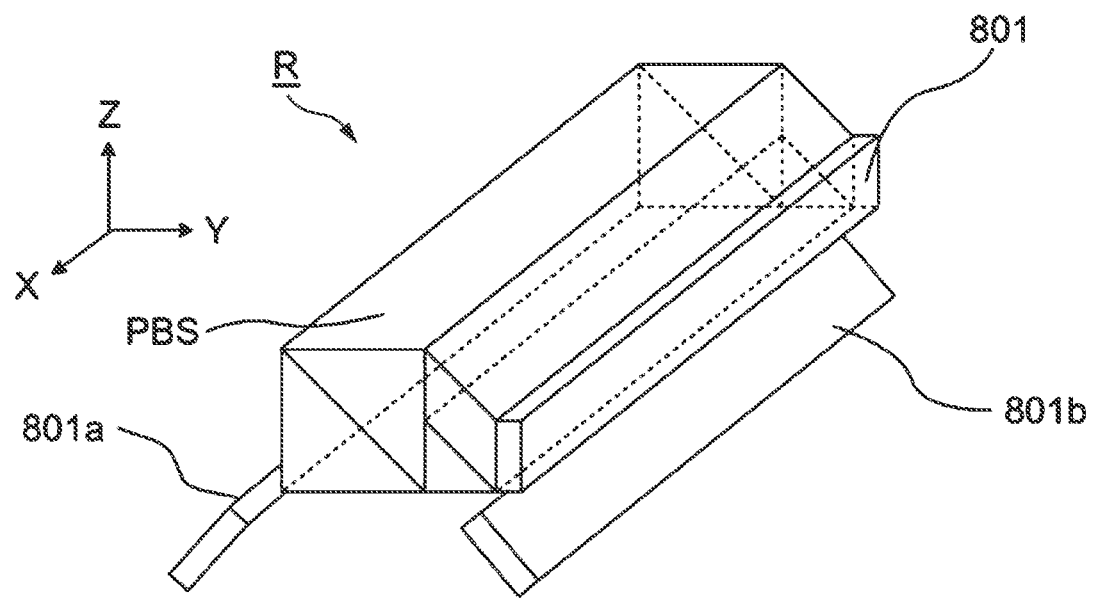

In order to always maintain the state in which the optical path length inside the optical assembly R remains unchanged regardless of the optical axis and the posture, each of the retroreflectors 202a, 202b, and 203 formed in the optical assembly R may be a planar retroreflector. FIGS. 8A and 8B show an arrangement in which the retroreflectors 202a, 202b, and 203 shown in FIGS. 2A and 2B are replaced with planar retroreflectors 801a, 801b, and 801, respectively. Alternatively, a planar retroreflector may be formed by arraying, in a single plane, multiple metasurfaces described in "Arbabi, A. et al. Planar metasurface retroreflector. Nat. Photo. 11, 415-420 (2017)", fine corner cube mirrors, or fine lens assemblies (cat's eyes). By employing the planar retroreflector, measurement errors depending on optical axis shifts of the measurement light 200 and the reference light 201 and the postures of the optical assembly R and the fine movement stage 508 can be eliminated, and a more robust interference encoder system ENC can be obtained.

Figure 3:
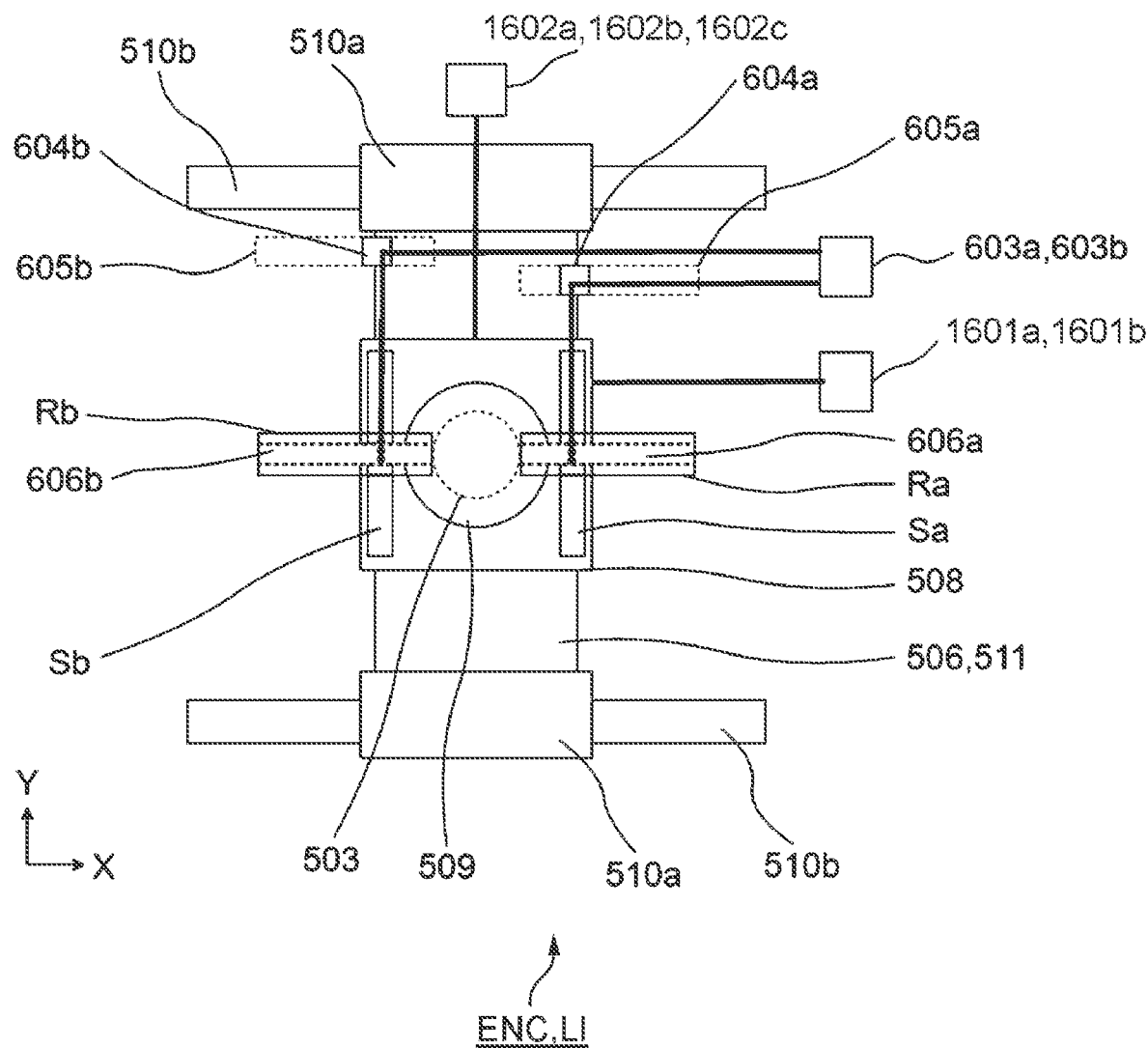
FIG. 3 is a perspective view schematically showing another configuration example of the measurement system including the interference encoder system and the laser interferometer system incorporated in the exposure apparatus.

FIG. 3 shows another configuration example of the measurement system including the interference encoder system ENC and the laser interferometer system LI incorporated in the exposure apparatus 500. In the configuration example shown in FIG. 3, the interference encoder system ENC includes two measurement devices. The first measurement device can include a scale Sa, an optical assembly Ra, a Z interferometer (interferometer) 603a, and mirrors 604a, 605a, and 606a. The second measurement device can include a scale Sb, an optical assembly Rb, a Z interferometer (interferometer) 603b, and mirrors 604b, 605b, and 606b. Each of the first measurement device and the second measurement device can be arranged so as to measure the positions of the fine movement stage 508 in the Z-axis direction and the Y-axis direction. In the configuration example shown in FIG. 3, the laser interferometer system LI includes the X laser interferometer group 1601 (1601a and 1601b) and the Y laser interferometer group 1602 (1602a, 1602b, and 1602c) described above.

First, the interference encoder system ENC will be described. The scales Sa and Sb can extend in the Y-axis direction, and be arranged along two sides, respectively, of the top surface of the fine movement stage 508 parallel to the Y-axis direction. The optical assembly Ra can be arranged so as to face the scale Sa in at least a part of the movable range of the fine movement stage 508, and extend in the X-axis direction. The optical assembly Rb can be arranged so as to face the scale Sb in at least a part of the movable range of the fine movement stage 508, and extend in the X-axis direction.

The Z interferometer 603a can provide measurement light and reference light to the optical assembly Ra via the mirrors 604a, 605a, and 606a, and receive the measurement light and the reference light returning from the optical assembly Ra. The Z interferometer 603a can measure or detect the positions of the fine movement stage 508 in the Z-axis direction and the Y-axis direction based on an interference fringe generated by the measurement light and the reference light. The Z interferometer 603b can provide measurement light and reference light to the optical assembly Rb via the mirrors 604b, 605b, and 606b, and receive the measurement light and the reference light returning from the optical assembly Rb. The Z interferometer 603b can measure or detect the positions of the fine movement stage 508 in the Z-axis direction and the Y-axis direction based on an interference fringe generated by the measurement light and the reference light. The controller 550 can detect the rotational angle of the fine movement stage 508 in the wz-axis direction based on the difference between the positions in the Y-axis direction measured by the Z interferometers 603a and 603b.

Next, the laser interferometer system LI will be described. Each of the X laser interferometers 1601a and 1601b can measure or detect the position of the fine movement stage 508 in the X-axis direction. The controller 550 can detect the position of the fine movement stage 508 in the wy-axis direction based on the difference between the positions in the X-axis direction measured by the X laser interferometers 1601a and 1601b. Each of the Y laser interferometers 1602a, 1602b, and 1602c can measure or detect the position of the fine movement stage 508 in the Y-axis direction. The controller 550 can detect the rotational angle of the fine movement stage 508 in the wx-axis direction based on the difference between the positions in the Y-axis direction measured by the Y laser interferometers 1602a and 1602b. The controller 550 can detect the rotational angle in the wz-axis direction based on the difference between the positions in the Y-axis direction measured by the Y laser interferometers 1602b and 1602c.

Even when the fine movement stage 508 moves in the movable range in the X-Y plane, the optical paths of the Z interferometers 603a and 603b above the fine movement stage 508 are not blocked, so that measurement light beams can always be applied to the scales Sa and Sb, respectively, on the top surface of the fine movement stage 508. The measurement light beam returning from each of the scales Sa and Sb can be returned to each of the Z interferometers 603a and 603b together with the reference light beam through the single optical path.

Both of a combination of the Y laser interferometers 1602b and 1602c and a combination of the Z interferometers 603a and 603b can measure the position in the Y-axis direction and the rotational angle in the wz-axis direction of the fine movement stage 508. The interference encoder type Z interferometers 603a and 603b may perform measurement in a short term/short section in a wide stroke or movable range of the fine movement stage 508, and the laser interferometer type Y laser interferometers 1602b and 1602c may be used to correct a variation in a long term/long section. A correction table used to correct measurement errors of the Z interferometers 603a and 603b, which depend on optical axis shifts of the measurement light and the reference light and the postures of the optical assemblies Ra and Rb and the fine movement stage 508, may be generated based on the measurement results of the Y laser interferometers 1602b and 1602c.

As has been described above, it is possible to provide a stage device mounted with an interference encoder system limited to the Z-axis and the Y-axis while using a conventional laser interferometer system. With this, it is possible to change to a highly accurate encoder system and improve the performance with almost no change in the overall layout of the exposure apparatus.

Figure 4:
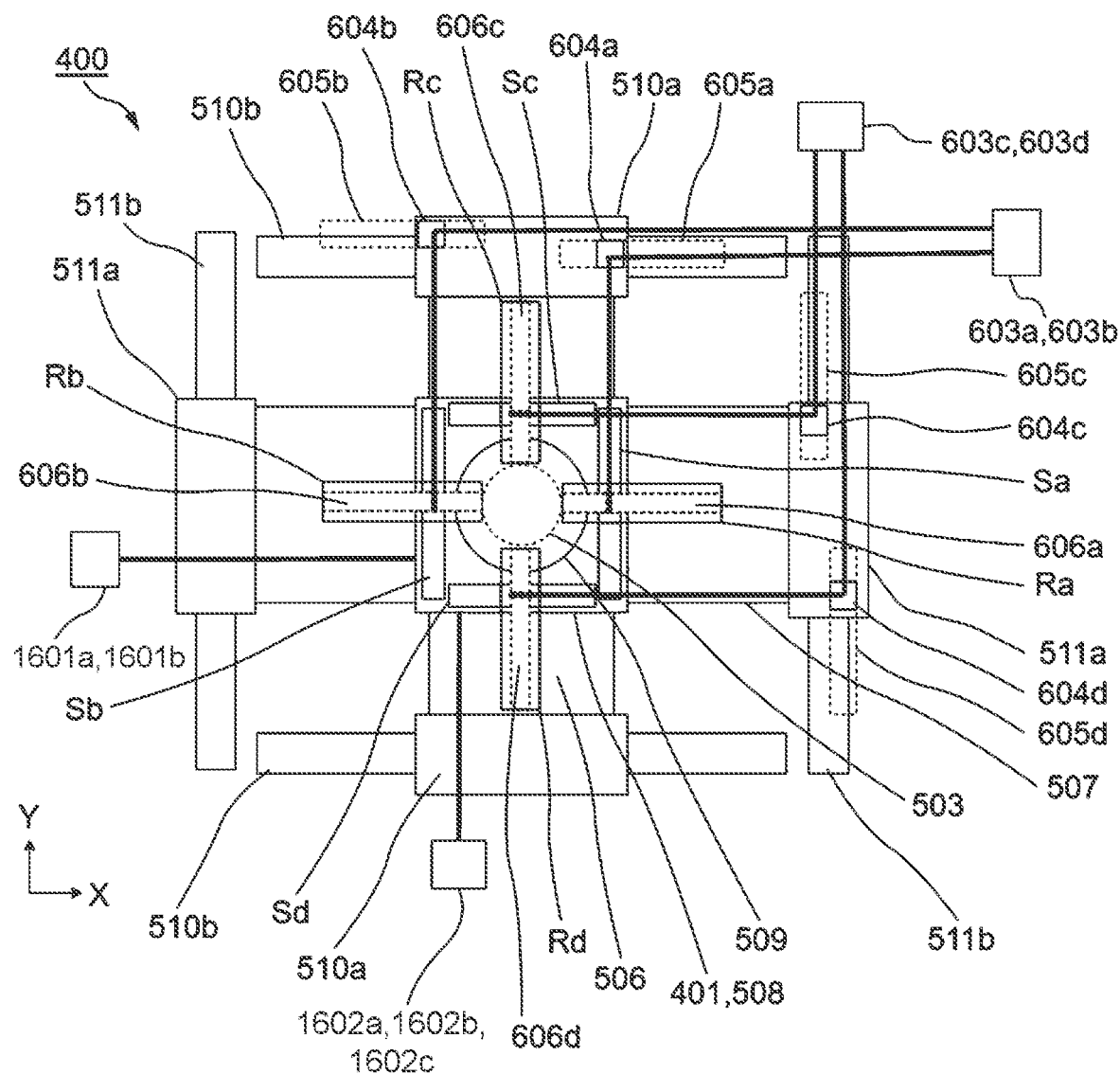
FIG. 4 is a perspective view schematically showing still another configuration example of the measurement system including the interference encoder system and the laser interferometer system incorporated in the exposure apparatus.
Figure 7:
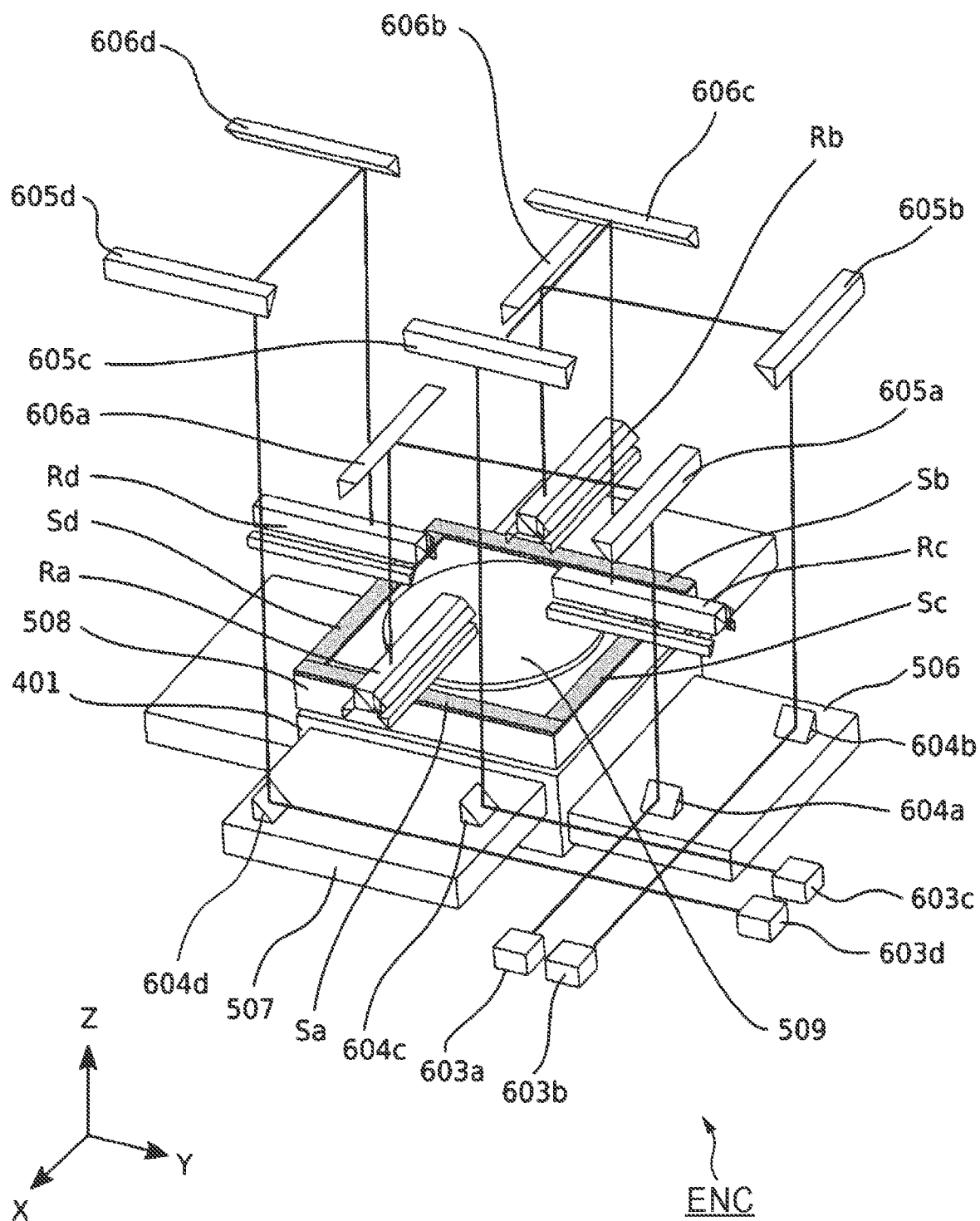
FIG. 7 is a perspective view showing a configuration example of the interference encoder system shown in FIG. 4.

FIG. 4 shows still another configuration example of the measurement system including the interference encoder system ENC and the laser interferometer system LI incorporated in the exposure apparatus 500. FIG. 7 shows the interference encoder system ENC from the interference encoder system ENC and the laser interferometer system LI shown in FIG. 4. It is possible to detect the position of the fine movement stage 508 with respect to six axes using the interference encoder system ENC and the laser interferometer system LI.

The exposure apparatus 500 includes a substrate stage mechanism 400 in place of the substrate stage mechanism 504 described above. The substrate stage mechanism 400 can have an arrangement in which the X stage 506 and the Y stage 507 cross each other. The substrate stage mechanism 400 can include the X stage 506, the Y stage 507, and an X-Y stage 401. The X stage 506 can move with a long stroke in the X-axis direction on the base 505. The Y stage 507 can move with a long stroke in the Y-axis direction on the base 505. The X-Y stage 401 can move in the X-axis direction and the Y-axis direction on the base 505 at a position where the X stage 506 and the Y stage 507 cross each other. The substrate stage mechanism 400 can include the fine movement stage 508 that is driven with a short stroke with respect to the X-Y stage 401 at six degrees of freedom, that is, with respect to the X-axis direction, the Y-axis direction, the Z-axis direction, the wx-axis direction, the wy-axis direction, and the wz-axis direction. The substrate chuck 509 that holds the substrate can be arranged on the fine movement stage 508. However, the substrate chuck 509 may be understood as a component of the fine movement stage 508.

The X stage 506, the Y stage 507, and the X-Y stage 401 can be supported by the base 505 via a gas bearing. The X stage 506 can be driven by the X linear motor including the X linear motor stator 510b, which can be formed by the plurality of coils arranged on the base 505, and the X linear motor movable element 510a, which can be formed by the permanent magnet provided in the X stage 506. The Y stage 507 can be driven by the Y linear motor including the Y linear motor stator 511b, which can be formed by the plurality of coils arranged on the base 505, and the Y linear motor movable element 511a, which can be formed by the permanent magnet provided in the Y stage 507. A bearing can be arranged between the X stage 506 and the X-Y stage 401. A bearing can be arranged between the Y stage 507 and the X-Y stage 401.

The fine movement stage 508 can be arranged on the X-Y stage 401, and driven with respect to the six axes by a plurality of actuators such as linear motors. Further, the fine movement stage 508 can be supported by a self-weight support mechanism (not shown) in a state in which the fine movement stage 508 is floating above the X-Y stage 401. A position sensor (for example, a linear encoder) can be arranged between the fine movement stage 508 and the X-Y stage 401. In an example, three linear encoders can be arranged so as to measure the positions of the fine movement stage 508 in the Z-axis direction, the wx-axis direction, and the wy-axis direction with respect to the Y stage 507. Such the position sensor can be used to measure the shape of the reflection surface of the fine movement stage 508 or perform calibration. Another sensor such as a capacitance sensor may be used in place of the linear encoder.

First, the interference encoder system ENC will be described. In the configuration example shown in FIGS. 4 and 7, the interference encoder system ENC includes four measurement devices. The first measurement device can include the scale Sa, the optical assembly Ra, the Z interferometer (interferometer) 603a, and the mirrors 604a, 605a, and 606a. The second measurement device can include the scale Sb, the optical assembly Rb, the Z interferometer (interferometer) 603b, and the mirrors 604b, 605b, and 606b. The third measurement device can include a scale Sc, an optical assembly Rc, a Z interferometer (interferometer) 603c, and mirrors 604c, 605c, and 606c. The fourth measurement device can include a scale Sd, an optical assembly Rd, a Z interferometer (interferometer) 603d, and mirrors 604d, 605d, and 606d.

Each of the scales Sa and Sb is formed by a thin plate, have an elongated shape extending in the Y-axis direction, and is arranged along a side of the top surface of the fine movement stage 508 parallel to the Y-axis direction. The length of each of the scales Sa and Sb in the Y-axis direction may be the minimum length required for driving of the fine movement stage 508 in the Y-axis direction. Also, the width of each of the scales Sa and Sb in the X-axis direction may be the minimum width required for reflecting the measurement light transmitted through each of the optical assemblies Ra and Rb. Gratings arrayed along the Y-axis direction with a nanometer-order fine pitch are provided in the surface of each of the scales Sa and Sb.

Each of the scales Sc and Sd is formed by a thin plate, have an elongated shape extending in the X-axis direction, and is arranged along a side of the top surface of the fine movement stage 508 parallel to the X-axis direction. The length of each of the scales Sc and Sd in the X-axis direction may be the minimum length required for driving of the fine movement stage 508 in the X-axis direction. Also, the width of each of the scales Sc and Sd in the Y-axis direction may be the minimum width required for reflecting the measurement light transmitted through each of the optical assemblies Rc and Rd. Gratings arrayed along the X-axis direction with a nanometer-order fine pitch are provided in the surface of each of the scales Sc and Sd.

The Z interferometer 603a provides measurement light and reference light to the optical assembly Ra via the mirrors 604a, 605a, and 606a, and receives the measurement light and the reference light returning from the optical assembly Ra. The Z interferometer 603a detects the positions of the fine movement stage 508 in the Z-axis direction and the Y-axis direction based on an interference fringe generated by the measurement light and the reference light. The Z interferometer 603b provides measurement light and reference light to the optical assembly Rb via the mirrors 604b, 605b, and 606b, and receives the measurement light and the reference light returning from the optical assembly Rb. The Z interferometer 603b detects the positions of the fine movement stage 508 in the Z-axis direction and the Y-axis direction based on an interference fringe generated by the measurement light and the reference light. The controller 550 can detect the rotational angle of the fine movement stage 508 in the wz-axis direction based on the difference between the positions in the Y-axis direction measured by the Z interferometers 603a and 603b.

The Z interferometer 603c provides measurement light and reference light to the optical assembly Rc via the mirrors 604c, 605c, and 606c, and receives the measurement light and the reference light returning from the optical assembly Rc. The Z interferometer 603c detects the positions of the fine movement stage 508 in the Z-axis direction and the Y-axis direction based on an interference fringe generated by the measurement light and the reference light. The Z interferometer 603d provides measurement light and reference light to the optical assembly Rd via the mirrors 604d, 605d, and 606d, and receives the measurement light and the reference light returning from the optical assembly Rd. The Z interferometer 603d detects the positions of the fine movement stage 508 in the Z-axis direction and the Y-axis direction based on an interference fringe generated by the measurement light and the reference light. The controller 550 can detect the rotational angle of the fine movement stage 508 in the wz-axis direction based on the difference between the positions in the Y-axis direction measured by the Z interferometers 603c and 603.

Each of the mirrors 605a, 605b, 606a, and 606b, the optical assembly Ra, and the optical assembly Rb has an elongated shape along the X-axis direction, and the Z interferometers 603a and 603b are arranged outside the substrate stage mechanism 400. The projection system 503 is arranged between the mirrors 606a and 606b. When the projection system 503 is located above one of the scale Sa and the scale Sb on the fine movement stage 508, position measurement can be performed using the other scale S. However, when the projection system 503 is located above one of the scale Sa and the scale Sb, the rotational angle in the wz-axis direction cannot be detected. In this case, the rotational angle in the wz-axis direction detected using the laser interferometer system LI can be utilized.

Each of the mirrors 605c, 605d, 606c, and 606d, the optical assembly Rc, and the optical assembly Rd has an elongated shape along the Y-axis direction, and the Z interferometers 603c and 603d are arranged outside the substrate stage mechanism 400. The projection system 503 is arranged between the mirrors 606c and 606d. When the projection system 503 is located above one of the scale Sc and the scale Sd on the fine movement stage 508, position measurement can be performed using the other scale S. However, when the projection system 503 is located above one of the scale Sc and the scale Sd, the rotational angle in the wz-axis direction cannot be detected. In this case, the rotational angle in the wz-axis direction detected using the laser interferometer system LI can be utilized.

In the configuration example shown in FIGS. 4 and 7, the laser interferometer system LI includes the X laser interferometers 1601a and 1601b and the Y laser interferometers 1602a, 1602b, and 1602c. Each of the X laser interferometers 1601a and 1601b measures the position of the fine movement stage 508 in the X-axis direction. The controller 550 can detect the position of the fine movement stage 508 in the wy-axis direction based on the difference between the positions in the X-axis direction measured by the X laser interferometers 1601*a* and 1601*b*. Each of the Y laser interferometers 1602*a*, 1602*b*, and 1602*c* measures the position of the fine movement stage 508 in the Y-axis direction. The controller 550 can detect the rotational angle of the fine movement stage 508 in the wx-axis direction based on the difference between the positions in the Y-axis direction measured by the Y laser interferometers 1602*a* and 1602*b*. Further, the controller 550 can detect the rotational angle in the wz-axis direction based on the difference between the positions in the Y-axis direction measured by the Y laser interferometers 1602*b* and 1602*c*.

Both of the interference encoder system ENC and the laser interferometer system LI can detect the position in the X-axis direction, the position in the Y-axis direction, the position (rotational angle) in the wz-axis direction, the position (rotational angle) in the wx-axis direction, and the position (rotational angle) in the wy-axis direction of the fine movement stage 508. In other words, at least some of positional information of the fine movement stage 508 detected using the interference encoder system ENC can also be detected using even the laser interferometer system LI.

The interference encoder type Z interferometers 603*a* to 603*d* may perform measurement in a short term/short section in a wide stroke or movable range of the fine movement stage 508, and the laser interferometer type laser interferometers 601 and 602 may be used to correct a variation in a long term/long section. A correction table used to correct measurement errors of the Z interferometers 603*a* to 603*d*, which depend on optical path shifts of the measurement light and the reference light or the postures of the optical assemblies Ra, Rb, Rc, and Rd and the fine movement stage 508, may be generated based on the measurement results of the laser interferometers 601 and 602.

According to the measurement system, the substrate stage device, or the exposure apparatus described with reference to FIGS. 4 and 7, the position of the fine movement stage 508 with respect to the six axes can be detected with high accuracy. Further, according to the configuration as described above, it is possible to employ a highly accurate encoder system with almost no change in the overall layout of a conventional exposure apparatus.

The measurement system described above is applicable to, for example, an imprint apparatus, a lithography apparatus such as a maskless charged-particle beam drawing apparatus, or a pattern transfer apparatus, in addition to an exposure apparatus. The measurement system described above is also applicable to an apparatus (for example, a microscope or a mechanical processing apparatus) that requires high positioning accuracy, in addition to a lithography apparatus.

An article manufacturing method of manufacturing an article using a lithography apparatus represented by the above-described exposure apparatus will be described below. The article manufacturing method can include a transfer step of transferring a pattern to a substrate using the above-described lithography apparatus, and a processing step of obtaining an article by processing the substrate to which the pattern has been transferred in the transfer step. When the lithography apparatus is an exposure apparatus, the article manufacturing method can include an exposure step of exposing, using the exposure apparatus, a substrate with a photosensitive agent applied thereto, a development step of developing the substrate (photosensitive agent), and a processing step of obtaining an article by processing the developed substrate. The processing step includes, for example, etching, resist removal, dicing, bonding, packaging, and the like. According to this article manufacturing method, a higher-quality article than a conventional one can be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-035636, filed Mar. 5, 2021, which is hereby incorporated by reference herein in its entirety.

What is claimed is:

1. A stage device comprising:
a stage capable of moving in a first direction and a second direction orthogonal to each other;
a scale arranged in the stage so as to extend in the first direction;
an optical assembly arranged so as to face the scale in at least a part of a movable range of the stage and extending in the second direction; and
an interferometer configured to transmit measurement light and reference light to the optical assembly, and receive the measurement light and the reference light returning from the optical assembly,
wherein the optical assembly is configured to apply the measurement light from the interferometer to the scale, and return the measurement light returning from the scale and the reference light to the interferometer, and
wherein the optical assembly comprises optical parts each having an elongated shape extending in the second direction and integrated to form an assembly including a beam splitter/combiner and a first retroreflector which are extending in the second direction.

2. The device according to claim 1,
wherein the beam splitter/combiner is configured to separate the measurement light and the reference light provided by the interferometer, and combine the measurement light and the reference light to be returned to the interferometer,
wherein the first retroreflector is configured to retroreflect the reference light emitted from the beam splitter/combiner to return the reference light to the beam splitter/combiner,
wherein the optical assembly further includes a second retroreflector configured to retroreflect, toward the scale, the measurement light emitted from the beam splitter/combiner and diffracted by the scale to return the measurement light to the beam splitter/combiner via the scale, and
wherein the beam splitter/combiner, the first retroreflector, and the second retroreflector extend in the second direction.

3. The device according to claim 2, wherein
each of the beam splitter/combiner, the first retroreflector, and the second retroreflector is a planar retroreflector.

4. The device according to claim 1, wherein
the scale is arranged on a top surface of the stage.

5. The device according to claim 1, further comprising:
a movable body configured to move in the second direction together with the stage;
a first mirror arranged in the movable body; and
a second mirror and a third mirror fixedly arranged away from the stage, the movable body, and the first mirror, and extending in the second direction,
wherein the first mirror, the second mirror, and the third mirror are arranged so as to form an optical path of each of the measurement light and the reference light between the interferometer and the optical assembly.

6. The device according to claim 1, further comprising:
a second scale arranged on the stage so as to extend in the first direction;
a second optical assembly arranged so as to face the second scale in at least a part of the movable range of the stage and extending in the second direction; and
a second interferometer configured to transmit measurement light and reference light to the second optical assembly, and receive the measurement light and the reference light returning from the second optical assembly,
wherein the second optical assembly is arranged away from the optical assembly in the first direction.

7. The device according to claim 6, further comprising
a laser interferometer system configured to measure a position of the stage,
wherein at least some of positional information of the stage detected using the scale, the optical assembly, the interferometer, the second scale, the second optical assembly, and the second interferometer is also detected using the laser interferometer system.

8. The device according to claim 7, further comprising
an actuator configured to be controlled so as to drive the stage based on information provided by the interferometer, the second interferometer, and the laser interferometer system.

9. The device according to claim 8, wherein
the laser interferometer system includes a laser interferometer configured to apply a measurement laser beam to a side surface of the stage.

10. The device according to claim 8, wherein
the laser interferometer system includes two laser interferometers configured to apply measurement laser beams to different height positions, respectively, in a side surface of the stage to obtain tilt information of the stage.

11. The device according to claim 1, further comprising
a laser interferometer configured to apply a measurement laser beam to a side surface of the stage to measure a position of the stage.

12. The device according to claim 1, further comprising
two laser interferometers configured to apply measurement laser beams to different height positions, respectively, in a side surface of the stage to obtain tilt information of the stage.

13. The device according to claim 1, wherein
one or more measurement devices are provided in addition to a measurement device comprised of the optical assembly and the interferometer to allow to measure the stage with respect to a plurality of axes.

14. A lithography apparatus that transfers a pattern of an original to a substrate, comprising:
a transfer unit configured to transfer the pattern of the original to the substrate; and
a stage device defined in claim 1, configured to position the substrate.

15. An article manufacturing method comprising:
transferring a pattern to a substrate using a lithography apparatus defined in claim 14; and
processing, to obtain an article, the substrate to which the pattern has been transferred in the transferring.

* * * * *